(12) United States Patent
Zhang et al.

(10) Patent No.: US 12,315,568 B2
(45) Date of Patent: *May 27, 2025

(54) MEMORY DEVICE AND PROGRAM OPERATION THEREOF

(71) Applicant: YANGTZE MEMORY TECHNOLOGIES CO., LTD., Wuhan (CN)

(72) Inventors: Huangpeng Zhang, Wuhan (CN); Zhichao Du, Wuhan (CN); Ke Jiang, Wuhan (CN); Cong Luo, Wuhan (CN); Daesik Song, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/404,690

(22) Filed: Jan. 4, 2024

(65) Prior Publication Data

US 2024/0145007 A1 May 2, 2024

Related U.S. Application Data

(63) Continuation of application No. 17/488,701, filed on Sep. 29, 2021, now Pat. No. 11,908,522, which is a
(Continued)

(51) Int. Cl.
*G11C 11/406* (2006.01)
*G06F 3/06* (2006.01)
(Continued)

(52) U.S. Cl.
CPC ............ *G11C 16/10* (2013.01); *G06F 3/0604* (2013.01); *G06F 3/0655* (2013.01);
(Continued)

(58) Field of Classification Search
CPC ....... G11C 16/10; G11C 16/08; G06F 3/0604; G06F 3/0655; G06F 3/0679
See application file for complete search history.

(56) References Cited

U.S. PATENT DOCUMENTS 11,908,522 B2 * 2/2024 Zhang ................ G11C 16/0483
2006/0258100 A1 11/2006 Mukunoki
(Continued)

FOREIGN PATENT DOCUMENTS

| CN | 1120688 A | 4/1996 |
|---|---|---|
| CN | 101814314 A | 8/2010 |
| KR | 20200046807 A | 5/2020 |

OTHER PUBLICATIONS

International Search Report issued in corresponding International Application No. PCT/CN2021/114921, mailed Apr. 27, 2022, 5 pages.

*Primary Examiner* — Min Huang
(74) *Attorney, Agent, or Firm* — BAYES PLLC

(57) ABSTRACT

In certain aspects, a memory device includes memory cells, word lines coupled to the memory cells, and a peripheral circuit coupled to the memory cells. The peripheral circuit is coupled to the word lines and configured to apply program pulses to a selected word line of the word lines in a program operation, obtain a number of occurrences of suspensions during the program operation, and determine a limit on a number of program pulses for the program operation based on the number of occurrences of the suspensions during the program operation.

20 Claims, 13 Drawing Sheets

Related U.S. Application Data continuation of application No. PCT/CN2021/114921, filed on Aug. 27, 2021.

(51) Int. Cl.
| | | |
|---|---|---|
| *G11C 16/04* | (2006.01) | |
| *G11C 16/08* | (2006.01) | |
| *G11C 16/10* | (2006.01) | |
| *G11C 11/56* | (2006.01) | |
| *H10B 43/27* | (2023.01) | |

(52) U.S. Cl.
CPC ........ *G06F 3/0679* (2013.01); *G11C 16/0483* (2013.01); *G11C 16/08* (2013.01); *G11C 11/5671* (2013.01); *H10B 43/27* (2023.02)

(56) References Cited

U.S. PATENT DOCUMENTS

| | | |
|---|---|---|
| 2010/0329004 A1 | 12/2010 | Hemink |
| 2019/0243577 A1* | 8/2019 | Pelster .................. G06F 3/0659 |
| 2020/0135283 A1 | 4/2020 | Park |

\* cited by examiner

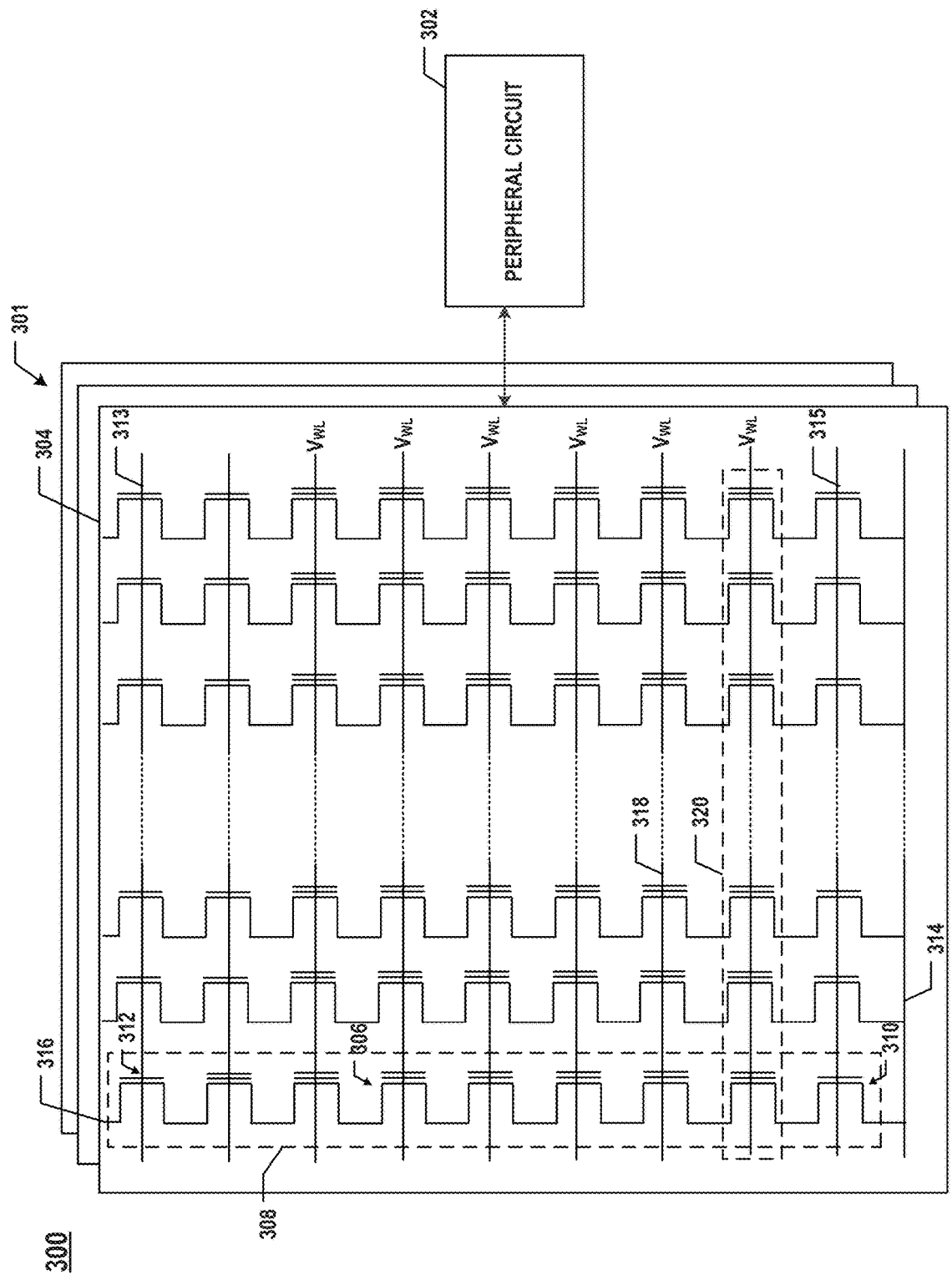

MEMORY DEVICE AND PROGRAM OPERATION THEREOF

CROSS-REFERENCE TO RELATED APPLICATIONS

This application is a continuation of U.S. application Ser. No. 17/488,701, field on Sep. 29, 2021, entitled "MEMORY DEVICE AND PROGRAM OPERATION THEREOF," which is a continuation of International Application No. PCT/CN2021/114921, filed on Aug. 27, 2021, entitled "MEMORY DEVICE AND PROGRAM OPERATION THEREOF," both of which are hereby incorporated by reference in their entireties.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes memory cells, and a peripheral circuit coupled to the memory cells. The peripheral circuit is configured to initiate a program operation on a selected memory cell of the memory cells, obtain a number of occurrences of one or more suspensions during the program operation, and determine a program pulse limit for the program operation based on the number of occurrences of the suspensions.

In another aspect, a system includes a memory device configured to store data, and a memory controller coupled to the memory device. The memory device includes memory cells, and a peripheral circuit coupled to the memory cells. The peripheral circuit is configured to initiate a program operation on a selected memory cell of the memory cells, obtain a number of occurrences of one or more suspensions during the program operation, and determine a program pulse limit for the program operation based on the number of occurrences of the suspensions. The memory controller is configured to transmit a program command to the peripheral circuit to initiate the program operation, and transmit one or more suspend commands after the program command to the peripheral circuit to cause the one or more suspensions during the program operation.

In still another aspect, a method for operating a memory device is provided. The memory device includes memory cells. A program operation is initiated on a select memory cell of the memory cells. A number of occurrences of one or more suspensions is obtained during the program operation. A program pulse limit for the program operation is determined based on the number of occurrences of the suspensions.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 3 illustrates a schematic diagram of a memory device including peripheral circuits, according to some aspects of the present disclosure.

Figure 1:
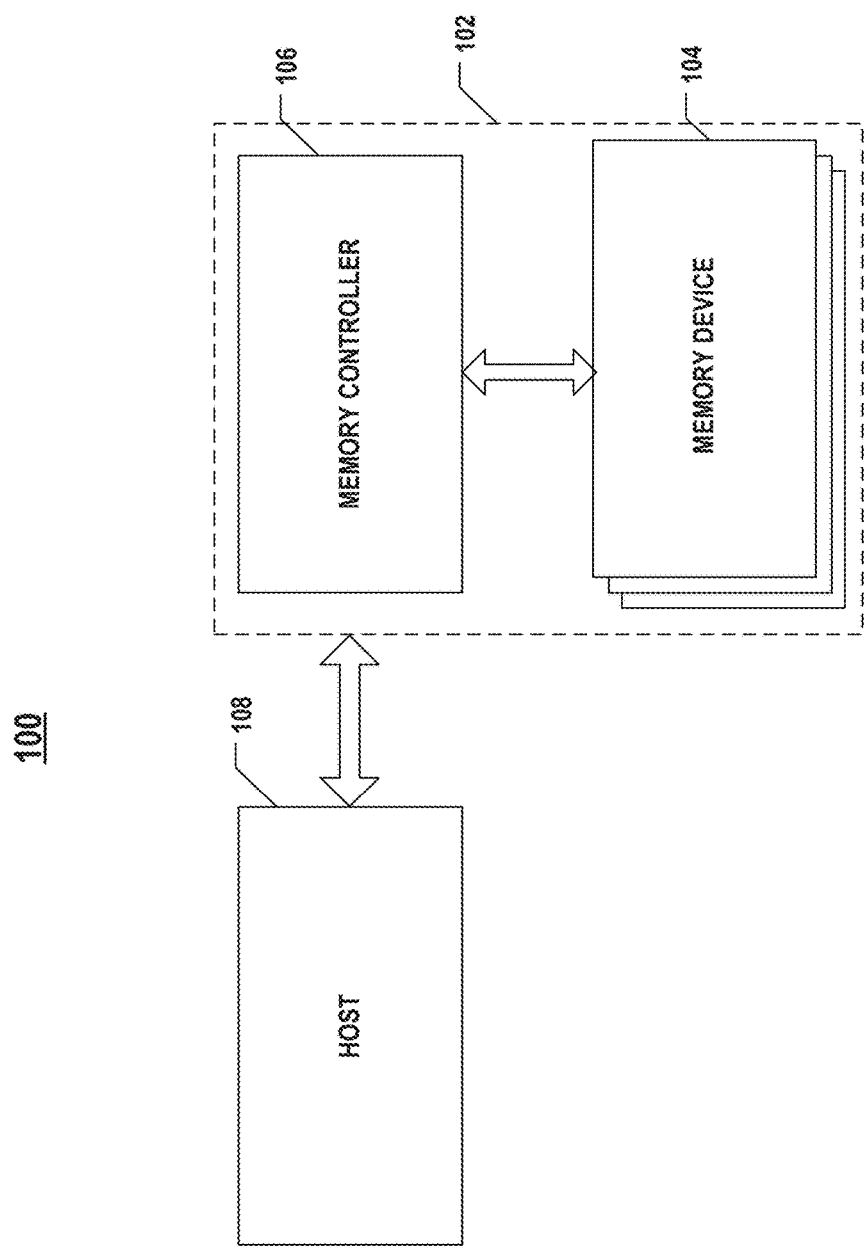
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

NAND Flash memory devices can perform program (write) operations at the page/word line level, i.e., programming all the memory cells coupled to the same select word line at the same time. Since each program operation takes a relatively long time (e.g., several hundred of microseconds ($\mu S$)) as it may involve multiple passes, each having multiple cycles of applying program pulses and verify pulses, NAND Flash memory devices usually support interrupts during a program operation on one page to suspend the ongoing program operation and switch to another operation (e.g., a read operation on another page). Once the other operation is finished, the suspended program operation can be resumed to program the original page.

During the suspended period (e.g., between the time when the program operation is suspended and the time when the program operation is resumed), the channel of each select memory string (e.g., a NAND memory string) is floating. The discharge of the program voltage applied on the select word line when programing the select page, in conjunction with the coupling capacitor between the select word line and the channel may cause a negative coupling potential in the channel. As a result, holes may be attracted by the negative potential and accumulated in the channel and the charge trap layer of the select memory cell. The extra holes accumulated during the program suspended period can increase the threshold voltage of the select memory cell, such that when the program operation is resumed, the select memory cell is easier to pass the verification even though the select memory cell may not be programmed to the desired threshold voltage level. Moreover, once the negative potential in the channel of the select memory string disappears after the program operation is resumed, the accumulated holes may be released as well, thereby reducing the threshold voltage. As a result, more fail bits can occur during the subsequent read operations at the programmed page due to the above-mentioned "over-program" issue associated with suspension/resumption in program operations.

To address the over-program issue, for program operations with an ISPP scheme, which gradually increases the voltages of the program pulses from the start voltage to the target voltage on a step-voltage basis (i.e., incremental voltage), the incremental voltage of the program pulse immediately after each resumption of the program operation (i.e., the first resumed program pulse) needs to be reduced from the default incremental voltage of normal program pulses.

On the other hand, program disturbance may occur to memory cells (e.g., in NAND memory strings) that have been verified (i.e., set to program inhibit state) when other memory cells sharing the same word line are still being programmed. In particular, if there is a leakage or other failures on the particular word line, the number of program pulses applied to the word line will keep increasing, which aggravates the program disturbance to the verified memory cells and shift the threshold voltage distribution thereof. Thus, an upper limit (maximum value) needs to be set to limit the total number of program pulses that can be applied to the word line in each program operation to avoid the threshold voltage shift due to program disturbance.

However, for program operations with an ISPP scheme, the reduced incremental voltage due to program suspension/resumption increases the number of program pulses that are needed to reach the target program voltage. As a result, the program operation may be forced to terminate when the program pulse limit is reached prematurely caused by frequent program suspension/resumption. Conversely, blindly relaxing the program pulse limit due to possible program suspension/resumption is also undesirable as it increases the risk of threshold voltage shift due to program disturbance.

To address one or more of the aforementioned issues, the present disclosure introduces a solution that dynamically adjusts the program pulse limit based on the number of occurrences of program suspension/resumption in each program operation, which balances the risk of threshold voltage shift due to program disturbance and the need of finishing the program operation maturely. By applying the dynamic program pulse limit adjusting scheme disclosed herein, for normal program operations that are not interrupted by suspension/resumption, a default program pulse limit remains intact to prevent threshold voltage shift due to program disturbance; and for program operations that are interrupted by suspension/resumption, the default program pulse limit can be relaxed to allow the program operation to finish correctly. The default program pulse limit can be preset based on various factors, for example, unrelated to suspension/resumption. In some implementations, the default program pulse limit is preset based on different program operations, different pages, etc. Moreover, in some implementations, the number of occurrences of program suspension/resumption is taken into consideration to dynamically and finely adjust the degree of relaxation to the program pulse limit in each program operation.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104. In order to send or receive data to or from memory devices 104, host 108 can send instructions to memory system 102 besides the data.

Memory device 104 can be any memory device disclosed in the present disclosure. As disclosed below in detail, memory device 104, such as a NAND Flash memory device, can support program operation suspension triggered by an interrupt. Memory device 104 can include memory cells, for example, in NAND memory strings. Consistent with the scope of the present disclosure, memory device 104 can obtain the number of occurrences of one or more suspensions during a program operation and determine the program pulse limit for the program operation based on the number of occurrences of the suspensions to regulate the maximum number of program pulses allowed in the ongoing program operation. As a result, the risk of threshold voltage shift due to program disturbance and the need to finish the program operation maturely can be balanced, and the performance of memory device 104 can be improved.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. For example, based on the instructions received from host 108, memory controller 106 may transmit various commands to memory device 104, e.g., program command, read command, erase command, etc., to control the operations of memory device 104. Consistent with the scope of the present disclosure, in some implementations, memory controller 106 transmits a program command to memory device 104 to initiate the program operation performed by memory device 104. During the ongoing program operation, interrupts/suspensions can occur, for example, from host 108, and memory controller 106 can be configured to transmit one or more suspend commands to memory device 104 to cause one or more suspensions during the program operation. In some implementations, once the other operation triggered by each suspension (e.g., a read operation) is completed, memory controller 106 can be further configured to transmit a resume command to memory device 104 to resume the suspended program operation. In some implementations, memory controller 106 records the number of occurrences of suspensions during the program operation for each memory device 104 and transmits the number of occurrences to the respective memory device 104.

Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
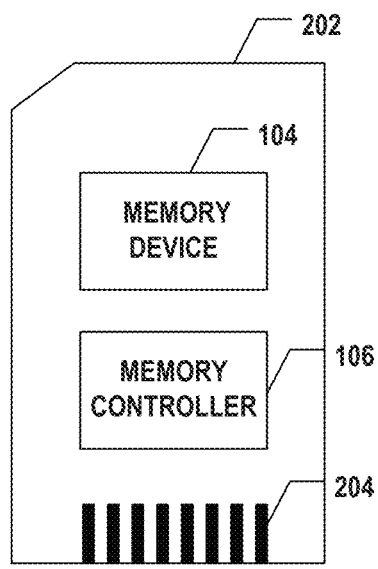
FIG. 2A illustrates a diagram of a memory card having a memory device, according to some aspects of the present disclosure.
Figure 2B:
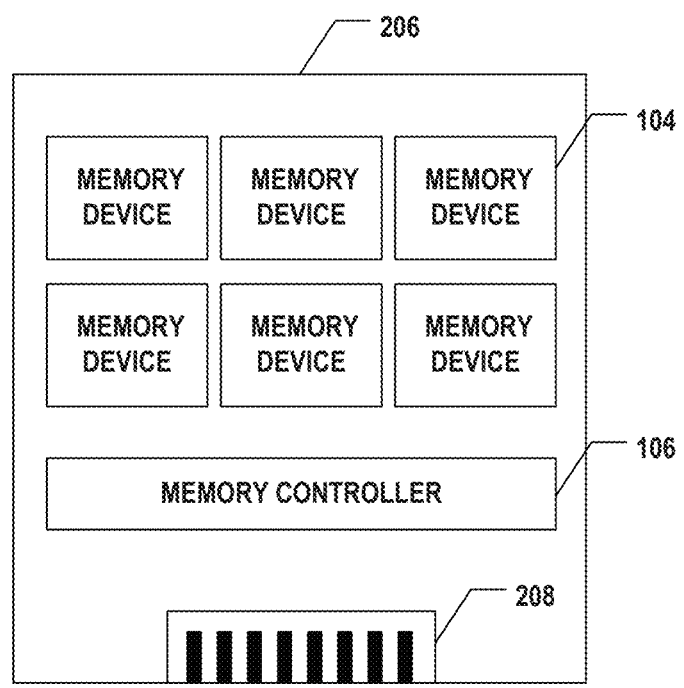
FIG. 2B illustrates a diagram of a solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, MMCmicro), an SD card (SD, miniSD, microSD, SDHC), a UFS, etc. Memory card 202 can further include a memory card connector 204 configured to couple memory card 202 to a host (e.g., host 108 in FIG. 1). In another example as shown in FIG. 2B, memory controller 106 and multiple memory devices 104 may be integrated into an SSD 206. SSD 206 can further include an SSD connector 208 configured to couple SSD 206 to a host (e.g., host 108 in FIG. 1). In some implementations, the storage capacity and/or the operation speed of SSD 206 is greater than those of memory card 202.

FIG. 3 illustrates a schematic circuit diagram of an exemplary memory device 300 including peripheral circuits 302, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a DSG select voltage or a DSG unselect voltage to the gate of respective DSG transistor 312 through one or more DSG lines 313 and/or by applying an SSG select voltage or an SSG unselect voltage to the gate of respective SSG transistor 310 through one or more SSG lines 315.

As shown in FIG. 3, NAND memory strings 308 can be organized into multiple blocks 304, each of which can have a common source (ACS) line 314, e.g., coupled to an ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program and read operations. The size of one page 320 in bits can relate to the number of NAND memory strings 308 coupled by word line 318 in one block 304. Each word line 318 can include a plurality of control gates (gate electrodes) at each memory cell 306 on respective page 320 and a gate line coupling the control gates.

Figure 4A:
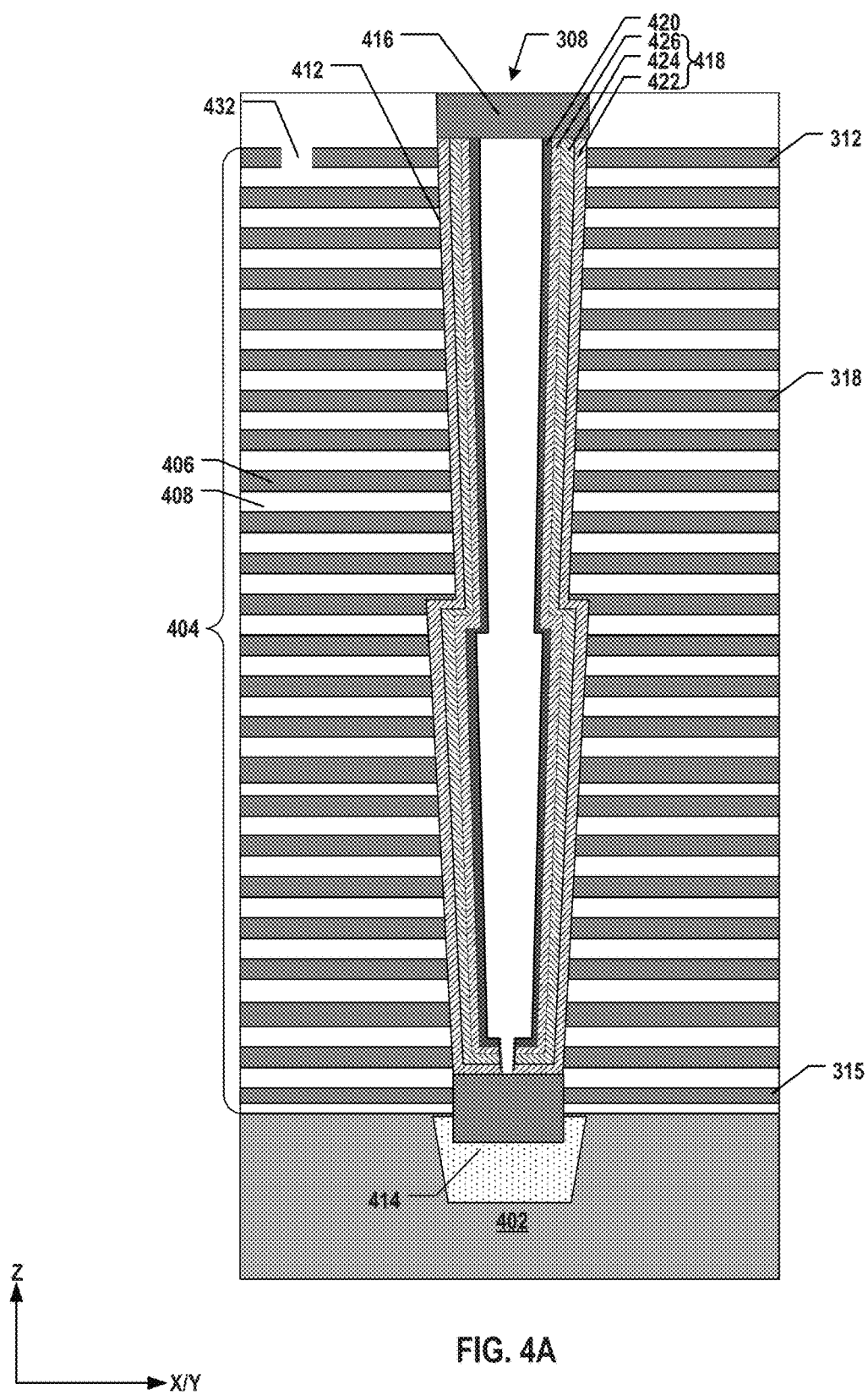
FIGS. 4A and 4B illustrate a side view and a plan view of cross-sections of a memory cell array including a NAND memory string, respectively, according to some aspects of the present disclosure.
Figure 4B:
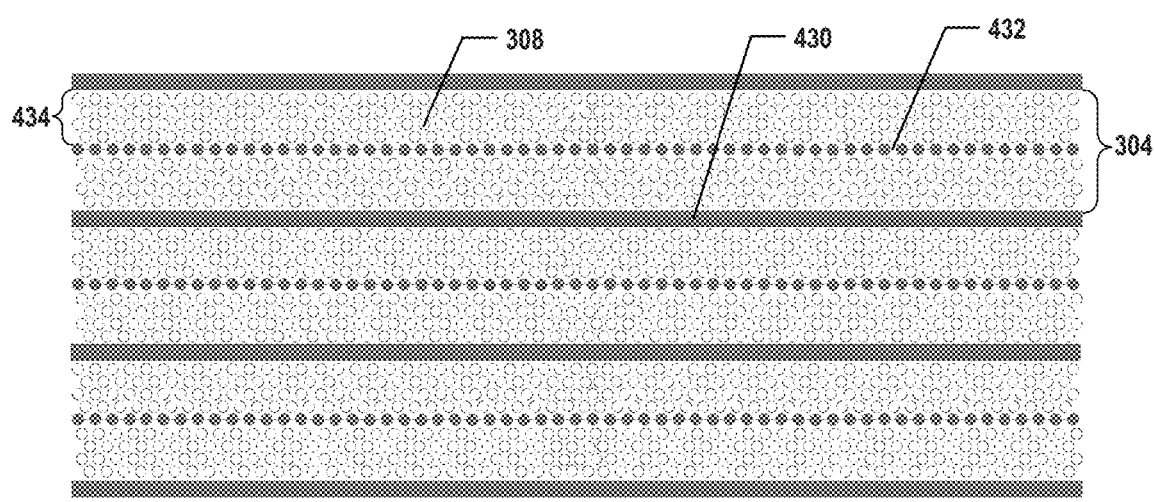

FIGS. 4A and 4B illustrate a side view and a plan view of cross-sections of an exemplary memory cell array 301 including NAND memory strings 308, respectively, according to some aspects of the present disclosure. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in a memory device. Substrate 402 includes two lateral surfaces extending laterally in the x-y plane: a top surface on the front side of the wafer on which the memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the memory device is determined relative to substrate 402 of the memory device in the z-direction (the vertical direction perpendicular to the x-y plane) when substrate 402 is positioned in the lowest plane of the memory device in the z-direction. The same notion for describing the spatial relationships is applied throughout the present disclosure.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include the control gates of memory cells 306, the gates of DSG transistors 312, or the gates of SSG transistors 310, and can extend laterally as DSG line 313 in the upper portion of memory stack 404, SSG line 315 in the lower portion of memory stack 404, or word line 318 between DSG line 313 and SSG line 315. It is understood that although one SSG line 315 and one DSG line 313 are shown in FIG. 4A, the number of SSG lines 315 and the number of DSG lines 313 (as well as the numbers of SSG transistors 310 and DSG transistors 312 coupled to the SSG lines 315 and DSG lines 313, respectively) may vary in other examples.

As shown in FIG. 4A, NAND memory string 308 includes a channel structure 412 extending vertically through memory stack 404. In some implementations, channel structure 412 includes a channel opening filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source of NAND memory string 308 is in contact with well 414, according to some implementations. For example, source line 314 may be coupled to well 414 to apply an erase voltage to well 414, i.e., the source of NAND memory string 308, during erase operations. As described above, during and after discharging the program voltage in a program operation in response to an interrupt, holes may be attracted from well 414 (e.g., P-well) and accumulated in semiconductor channel 420 and storage layer 424 due to a negative potential coupled in semiconductor channel 420. In some implementations, NAND memory string 308 further includes a channel plug 416 at the drain end of NAND memory string 308, e.g., as part of the drain of NAND memory string 308.

As shown in the plan view of FIG. 4B, NAND memory strings 308 of memory cell array 301 can be arranged into blocks 304 by slit structures 430 (e.g., gate line slits (GLSs)), which electrically separate word lines 318 between adjacent blocks 304, such that each block 304 can be individually controlled in read, program, and erase operations. In one example, each slit structure 430 may extend along the x-direction (e.g., the word line direction), and multiple blocks 304 may be arranged along the y-direction (e.g., the bit line direction). In some implementations, each block 304 can be further divided into smaller areas (e.g., fingers 434) by DSG cuts 432, which electrically separate DSG lines 313 between adjacent fingers 434, such that DSG lines 313 in different fingers 434 may be individually controlled in read and program operations.

As shown in the side view of FIG. 4A, channel structure 412 of NAND memory string 308 can include a nonuniform lateral dimension (e.g., diameter) along the vertical direction as a result of a deep hole etching process, such as deep reach ion etch (DRIE). Due to the nonuniform lateral dimension distribution along the vertical direction of channel structure 412, memory cells 306 coupled to word lines 318 (some of gate conductive layer 406) at different locations (depths) can be associated with different channel lateral dimensions, e.g., the diameter. As a result, the program speeds of memory cells 306 coupled to word lines 318 at different locations vary as well, according to some implementations.

Figure 5:
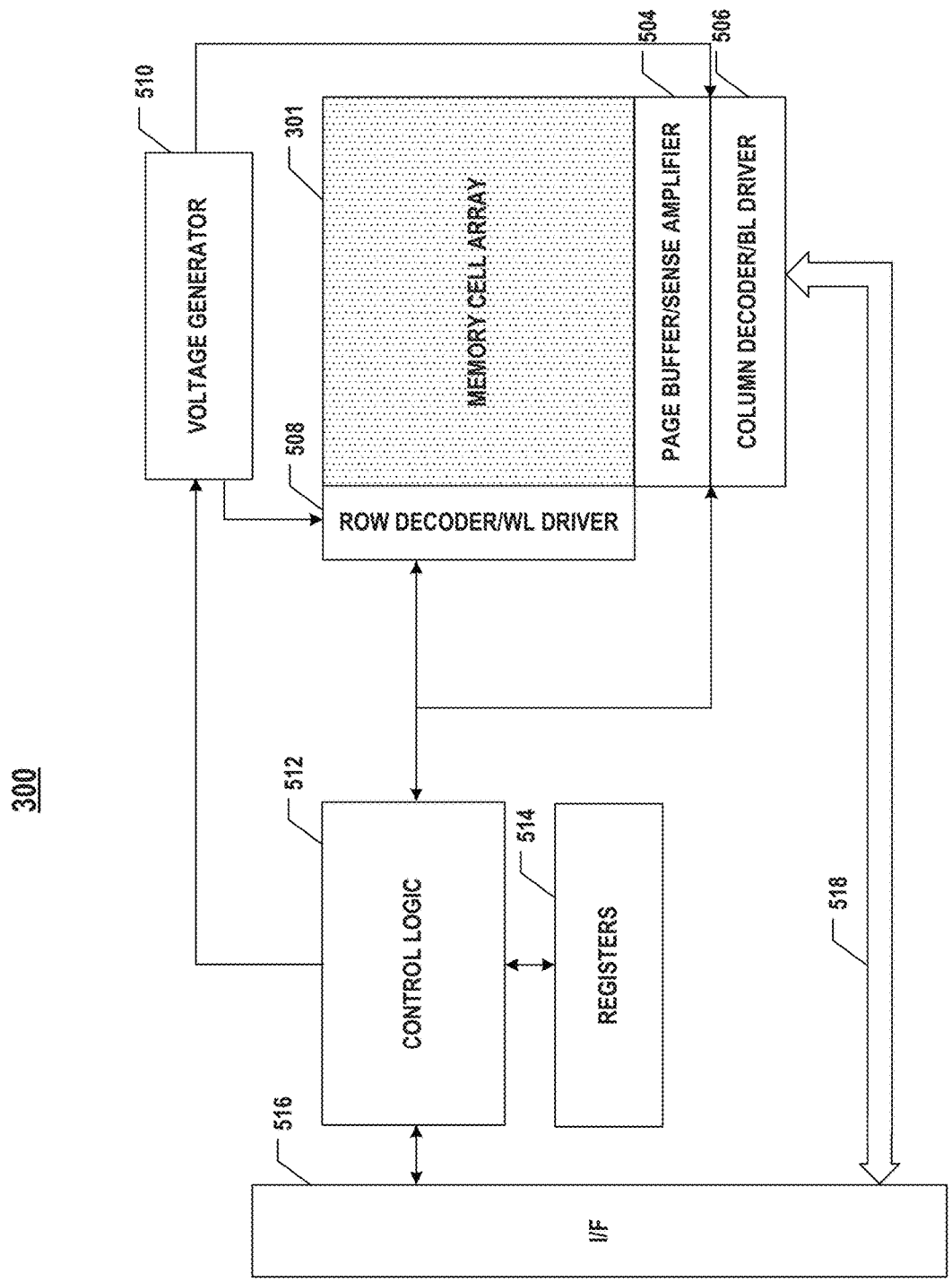
FIG. 5 illustrates a block diagram of a memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target (select) memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into select memory cells 306 coupled to select word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 can be configured to be controlled according to the control signals by control logic 512 and select/unselect blocks 304 of memory cell array 301 and select/unselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315, and DSG lines 313 as well using SSG voltages and DSG voltages generated from voltage generator 510.

Voltage generator 510 can be configured to be controlled by control logic 512 and generate the various word line voltages (e.g., read voltage, program voltage, pass voltage, verification voltage), SSG voltages (e.g., select/unselect voltages), DSG voltages (e.g., select/unselect voltages), bit line voltages (e.g., ground voltage), and source line voltages (e.g., ground voltage) to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit.

In some implementations, control logic 512 can receive a program command issued by a memory controller (e.g., memory controller 106 in FIG. 1) and send control signals to various peripheral circuits, such as row decoder/word line driver 508, column decoder/bit line driver 506, and voltage generator 510 to initiate the program operation on select memory cells 306 coupled to select word line 318. In response to receiving a suspend command issued by the memory controller during the ongoing program operation, control logic 512 can send control signals to various peripheral circuits, such as row decoder/word line driver 508, column decoder/bit line driver 506, and voltage generator 510, to suspend the program operation and initiate another operation triggered by the suspend command (e.g., a read operation). In some implementations, registers 514 are configured to store the information of the suspended program operation, such as the programming page, the program pass, and the program/verify cycle at which the program operation is suspended, etc., which is necessary for resuming the suspended program operation. In some implementations, control logic 512 is configured to check the status of the other operation from status registers of registers 514. In response to completion of the other operation (e.g., read operation), control logic 512 is further configured to retrieve the information of the suspended program operation stored in registers 514 and send control signals to various peripheral circuits, such as row decoder/word line driver 508, column decoder/bit line driver 506, and voltage generator 510 to resume the suspended read operation based on the retrieved information from registers 514, according to some implementations.

Consistent with the scope of the present disclosure, during the ongoing program operation, control logic 512 can obtain the number of occurrences of one or more suspensions during the program operation and can then determine the program pulse limit for the program operation based on the number of occurrences of the suspensions. In some implementations, control logic 512 is configured to track the number of occurrences of the suspensions during the program operation, and registers 514 are configured to store the tracked number of occurrences of the suspensions. In some implementations, control logic 512 is configured to receive the number of occurrences of the suspensions during the program operation from the memory controller (e.g., memory controller 106 in FIG. 1). In response to the number of program pluses in the program operation reaching the program pulse limit, control logic 512 can send control signals to various peripheral circuits, such as row decoder/word line driver 508, column decoder/bit line driver 506, and voltage generator 510, to terminate the program operation. Otherwise, the program operation finishes when all selected memory cells 306 coupled to select word line 318 are verified (successfully programmed), according to some implementations.

Interface 516 can be coupled to control logic 512 and act as a control buffer to buffer and relay control commands (e.g., program command and suspend command) received from a memory controller (e.g., memory controller 106 in FIG. 1) to control logic 512 and status information (e.g., the number of suspension occurrences) received from control logic 512 to the memory controller. Interface 516 can also be coupled to column decoder/bit line driver 506 via data bus 518 and act as a data input/output (I/O) interface and a data buffer to buffer and relay the data to and from memory cell array 301.

Figure 6:
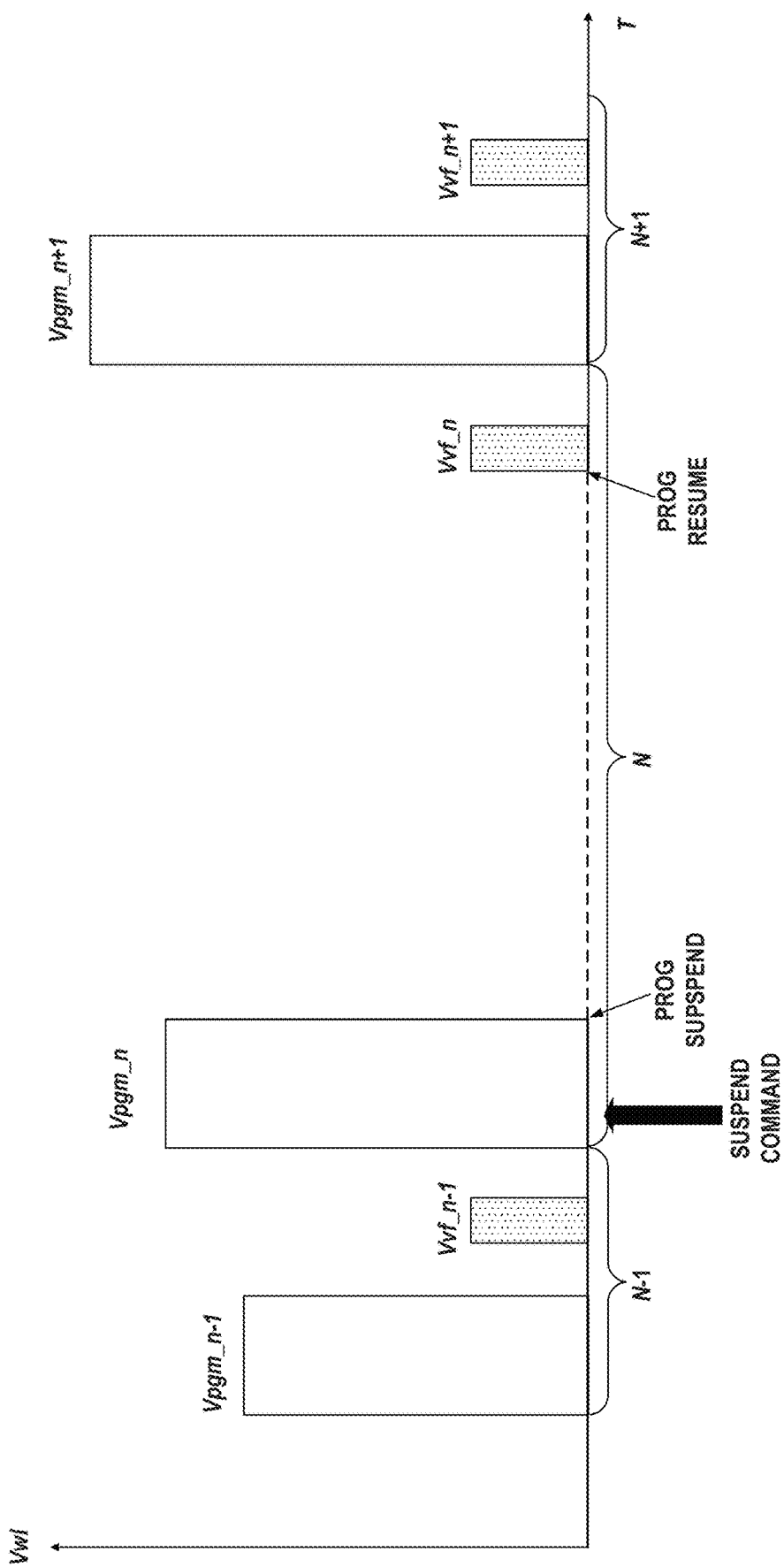
FIG. 6 illustrates a scheme of program operation suspension and resumption, according to some aspects of the present disclosure.

FIG. 6 illustrates a scheme of program operation suspension and resumption, according to some aspects of the present disclosure. As shown in FIG. 6, to program the select memory cells coupled to a select word line, one or more program/verify cycles (N−1, N, N+1, . . . ) are included in the program operation in sequence. During the program operation, in any program/verify cycle, a program voltage (e.g., Vpgm_n−1, Vpgm_n, or Vpgm_n+1) is applied to the select word line to program the select memory cells coupled to the select word line, followed by applying a verify voltage (e.g., Vvf_n−1, Vvf_n, or Vvf_n+1) to check whether the threshold voltage of each programmed memory cell reaches the verify voltage (i.e., verified/successfully programmed). If one or more memory cells (verification-failed memory cells) fail to pass the verification, i.e., their threshold voltages are below the verify voltage, a subsequent program/verify cycle is then applied on the verification-failed memory cells with an increased program voltage.

When an interrupt, for example, an instruction from a host to perform a read operation, occurs during the program operation, a suspend command is issued to suspend the program operation. As shown in FIG. 6, when the suspend command is issued while applying the program voltage (Vpgm_n), the program operation is suspended without applying the verify voltage (Vvf_n) in the same program/verify cycle once the program voltage is fully discharged. The program operation then enters into a suspended state (represented in the dashed line) until the other operation triggered by the interrupt is finished. Once the program operation is resumed, the corresponding verify voltage in the same program/verify cycle is applied to finish this extended program/verify cycle. The duration of the suspended state depends on the duration of the other operation triggered by the interrupt, according to some implementations.

In some implementations, program voltages (e.g., Vpgm_n−1, Vpgm_n, and Vpgm_n+1) are applied following an ISPP scheme, which is commonly used in operation operations of memory devices, such as NAND Flash memory devices, to achieve fast program performance under process and environmental variations while keeping a tight programmed cell threshold voltage distribution. The ISPP scheme can program the selected memory cells several times while gradually increasing the word line bias voltage (program voltages) on a step-voltage basis. The magnitude of this "step" (e.g., the increase in the magnitude of each program pulse relative to the immediately previous program pulse) is referred to herein as the incremental voltage (a.k.a. pulse step height).

As described above, during the suspended period, the channel of each select memory string (e.g., NAND memory string 308 in FIG. 4A) is floating. The discharge of the program voltage applied on the select word line when programing the select page, in conjunction with the coupling capacitor between the select word line and the channel may cause a negative coupling potential in the channel. As a result, holes may be attracted by the negative potential, for example, from a P-well (e.g., well 414 in FIG. 4A) and accumulated in the channel and the charge trap layer of the select memory cell. The extra holes accumulated during the program suspended period can increase the threshold voltage of the select memory cell, such that when the program operation is resumed, the select memory cell becomes easier to pass the verification even though the select memory cell may not be programmed to the desired threshold voltage level. Moreover, once the negative potential in the channel of the select memory string disappears after the program operation is resumed, the accumulated holes may be released as well, thereby reducing the threshold voltage. As a result, more fail bits can occur during the subsequent read operations at the programmed page due to the above-mentioned "over-program" issue associated with suspension/resumption in program operations.

Figure 7:
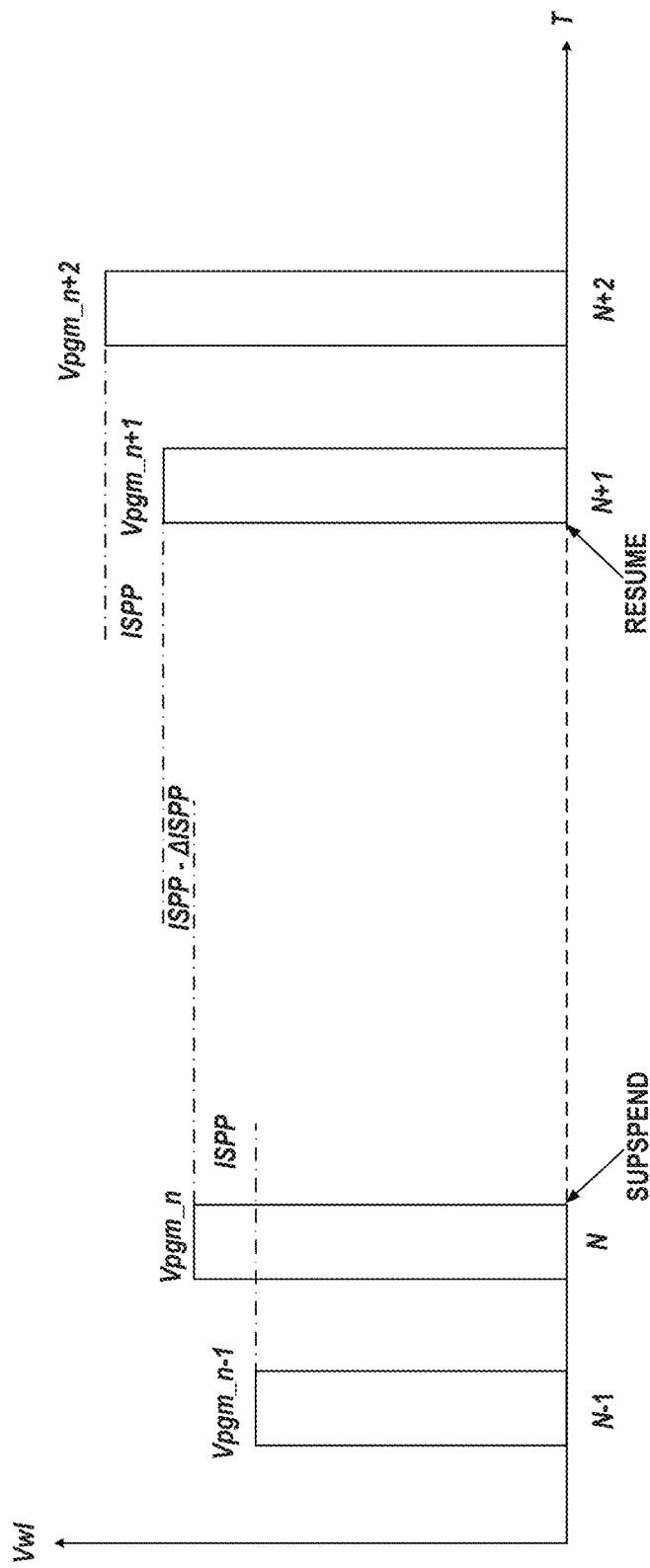
FIG. 7 illustrates a scheme of incremental step pulse programming (ISPP) in response to program operation suspension and resumption, according to some aspects of the present disclosure.

FIG. 7 illustrates a scheme of ISPP in response to program operation suspension and resumption, according to some aspects of the present disclosure. To overcome the over-program issue associated with suspension/resumption in program operations using an ISPP scheme, as shown in FIG. 7, the default incremental voltage (ISPP) is reduced for the respective program pulse (e.g., Vpgm_n+1) that is immediately after each resumption of the program operation, according to some implementations. That is, the program pulses can be divided into two types: the resumed program pulse(s) (e.g., Vpgm_n+1) that are immediately after each resumption of the program operation, and other program pulse(s) (e.g., Vpgm_n−1, Vpgm_n, and Vpgm_n+2) that are not immediately after each resumption of the program operation. Similarly, the incremental voltages used by the ISPP scheme can also be divided into two types: the resumed incremental voltage for resumed program pulse(s) (e.g., the voltage difference between Vpgm_n and Vpgm_n+1), and the default incremental voltage (ISPP) for other program pulse(s). In some implementations, the resumed incremental voltage (ISPP−ΔISPP) is smaller than the default incremental voltage (ISPP), for example, by ΔISPP, as shown in FIG. 7. That is, by reducing the incremental voltage between the program voltages before and after each suspension, the undesired threshold voltage increase due to suspension in the program operation can be compensated.

Figure 8:
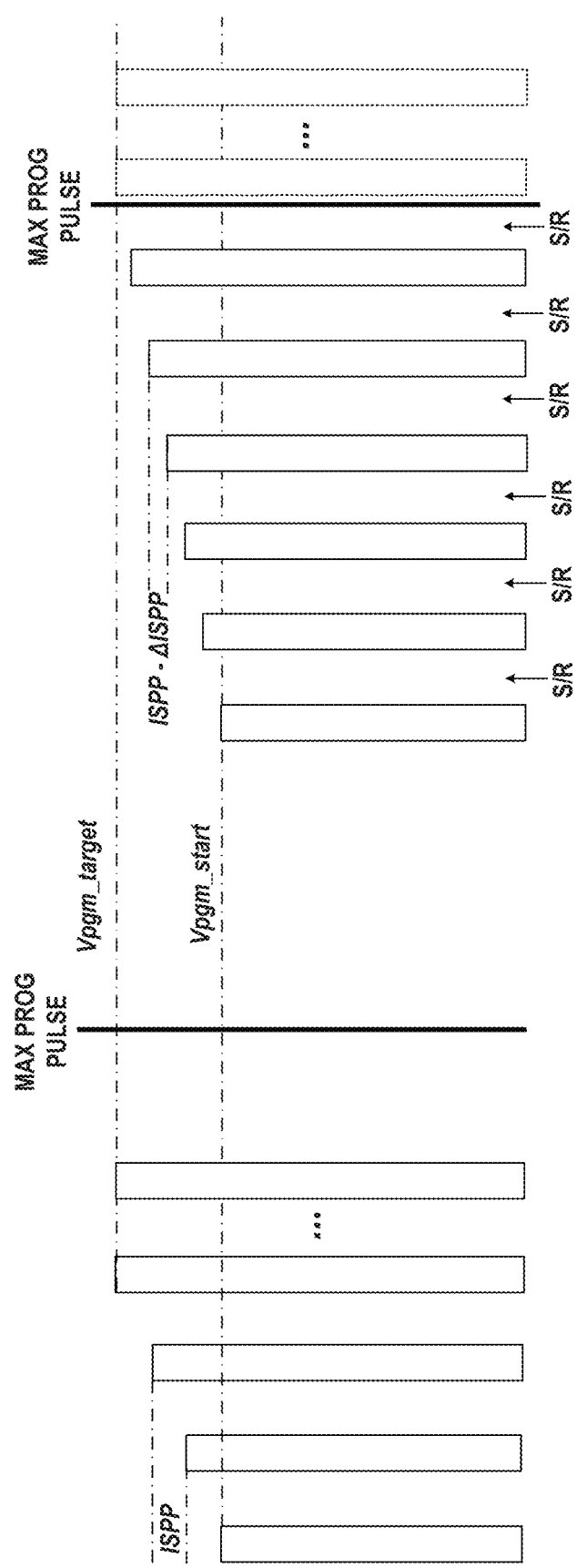
FIG. 8 illustrates a comparison between a normal ISPP program operation and an ISPP program operation with program suspension and resumption, according to some aspects of the present disclosure.

FIG. 8 illustrates a comparison between a normal ISPP program operation and an ISPP program operation with program suspension and resumption, according to some aspects of the present disclosure. In a normal ISPP program operation without any program suspension (shown on the left side of FIG. 8), the voltages of program pulses gradually increase from the start program voltage (Vpgm start) to the target program voltage (Vpgm target) with a default incremental voltage (ISPP) between two adjacent program pulses, according to some implementations. After reaching the target voltage, the program pulse(s) are continuously applied at the target voltage if there is still at least one selected memory cell (verification-failed memory cells) that has not been verified (i.e., not passing the verification), according to some implementations. On the other hand, a preset program pulse limit (Max Prog Pulse) can limit the total number of program pulses in the ongoing program operation to manage the risk of threshold voltage shift due to program disturbance, as described above in detail. For example, for an ISPP scheme with a start voltage of 10 V, a target voltage of 20 V, and a default incremental voltage of 1 V, a normal program operation may take 11 program pulses (including 10 V and 20 V program pulses) to reach the target voltage. If the default program pulse limit is set as 20, the normal program operation in this example may still have up to 9 program voltages at 20 V before being terminated.

Conversely, the resumed incremental voltage used by an ISPP program operation with program operation suspension and resumption can cause more program pulses to be used to reach the same target program voltage because the resumed incremental voltage is smaller than the default incremental voltage. The number of extra program pulses is associated with the number of suspension occurrences in the program operation, according to some implementations. For example, the more program suspension and resumption occur in a program operation, the more program pulses may be needed to reach the same target program voltage. The increased number of program pulses needed to reach the program target voltage can make the same default program pulse limit easier to reach, thereby reducing the number of program pulses at the target program voltage that is allowed under the limit. As a result, the chance that a program operation is terminated prematurely (not having enough chance to try programming all selected cells) can be increased under the same default program pulse limit.

Taking the extreme case in a program operation, for example, in which the program operation suspension and resumption (S/R) occurs after each program pulse (shown on the right side of FIG. 8), the resumed incremental voltage (ISPP–ΔISPP) essentially replaces the default incremental voltage for each program pulse. For example, for the same ISPP scheme with the start voltage of 10 V, the target voltage of 20 V, and a resumed incremental voltage of 0.5 V for each program pulse, it may take 21 program pulses (including 10 V and 20 V program pulses) to reach the same target voltage. If the default program pulse limit is still set as 20, the program operation in this example may be terminated even before reaching the target program voltage. On the other hand, if the default program pulse limit is relaxed (e.g., increased to 25) to accommodate the program operation with program suspension and resumption, then the relaxed program pulse limit may not fit the normal program operations, and the risk of threshold voltage shift due to program disturbance in normal program operations may be increased.

Consistent with the scope of the present disclosure, instead of using the same default program pulse limit for all program operations, the program pulse limit can be dynamically adjusted for different program operations depending on the number of suspension occurrences, thereby balancing the risk of threshold voltage shift due to program disturbance and the need of finishing the program operation maturely. The various schemes of dynamic program pulse limit adjustment adaptive to program suspension and resumption are described below in detail. The various schemes can be implemented by memory device 300 described above with respect to FIGS. 3, 4A, 4B, and 5.

As shown in FIGS. 3, 4A, and 5, control logic 512 of peripheral circuits 302 can be configured to initiate a program operation on a select memory cell 306 of a NAND memory string 308. In some implementations, control logic 512 receives a program command from a memory controller (e.g., memory controller 106) through interface 516, and in response, sends control signals to at least row decoder/word line driver 508, column decoder/bit line driver 506, and voltage generator 510 to initiate the program operation on select memory cell 306 coupled to select word line 318. Depending on the number of states to be programmed (i.e., the number of bits in each memory cell 306, e.g., SLC, MLC, TLC, QLC, etc.), one or more program passes can be performed. As shown in FIG. 7, in each program pass, one or more program/verify cycles (e.g., N−1, N, N+1, N+2, . . . ) can be included in the program operation in sequence. During the program operation, in any program/verify cycle, a program voltage (i.e., a voltage pulse signal including one or more program pulses, e.g., Vpgm_n−1, Vpgm_n, Vpgm_n+1, and Vpgm_n+2) is applied to select word line 318 by word line driver 508 to program select memory cell 306 coupled to select word line 318.

Referring back to FIGS. 3, 4A, and 5, control logic 512 of peripheral circuits 302 can also be configured to receive one or more suspend commands, for example, from a memory controller (e.g., memory controller 106 in FIG. 1) during some program operations (not in all the program operations, such as normal program operation without suspensions). The suspend command is issued by the memory controller when an interrupt occurs, according to some implementations. The interrupt can be any request by a host (e.g., host 108 in FIG. 1) that needs to interrupt the ongoing program operation performed by memory device 300, so that the event can be processed in a timely manner. For example, a read operation may need to be performed on page 320 of memory cell array 301 immediately before the completion of the currently performed program operation. It is understood that any suitable interrupt event may trigger the memory controller to transmit a suspend command to control logic 512 of peripheral circuits 302 to suspend the ongoing program operation in order to perform another operation, e.g., a read operation, firstly. In some implementations, the interrupt occurs while applying a program pulse on select word line 318. It is also understood that the interrupt (and the receipt of the suspend command) may occur in any program/verify cycle (including the first cycle, the last cycle, or any intermediate cycles) or in a single program/verify cycle. It is further understood that the number of the interrupts event and the resulting suspend commands may vary during different program operations, for example, from 0 (i.e., a normal program operation) to the same number as the program pulses (e.g., in FIG. 8).

In response to receiving a suspend command, peripheral circuits 302 can be configured to suspend the ongoing program operation. In some implementations, control logic 512 is configured to store the information of the suspended program operation, such as the programming page, the program pass and the program/verify cycle at which the program operation is suspended, etc., which is necessary for resuming the suspended program operation, into registers 514. Control logic 512 can then send control signals to other peripheral circuits 302 to perform the other operation triggered by the received interrupt command, for example, row decoder/word line driver 508, column decoder/bit line driver 506, and voltage generator 510 to perform a read operation on another page 320 of memory cell array 301. The corresponding programming page of memory device 300 can then enter into the program suspension state. In response to the completion of the other operation triggered by the interrupt, peripheral circuits 302 can be configured to resume the suspended program operation. In some implementations, control logic 512 is further configured to retrieve the information of the suspended program operation stored in registers 514 and send control signals to at least row decoder/word line driver 508, column decoder/bit line driver 506, and voltage generator 510 to resume the suspended program operation based on the retrieved information from registers 514, according to some implementations.

In some implementations, an ISPP scheme is applied to the program operation, such that row decoder/word line driver 508 applies one or more program pulses with incremental voltages to select word line 318. Depending on whether a program suspension occurs during the program operation, the incremental voltages between adjacent program pulses can include a default incremental voltage (ISPP) only (not shown) or the default incremental voltage (e.g., between Vpgm_n and Vpgm_n−1 and between Vpgm_n+2 and Vpgm_n+1 in FIG. 7) and a resumed incremental voltage (ISPP−ΔISPP, e.g., between Vpgm_n+1 and Vpgm_n in FIG. 7) smaller than the default incremental voltage.

Figure 9:
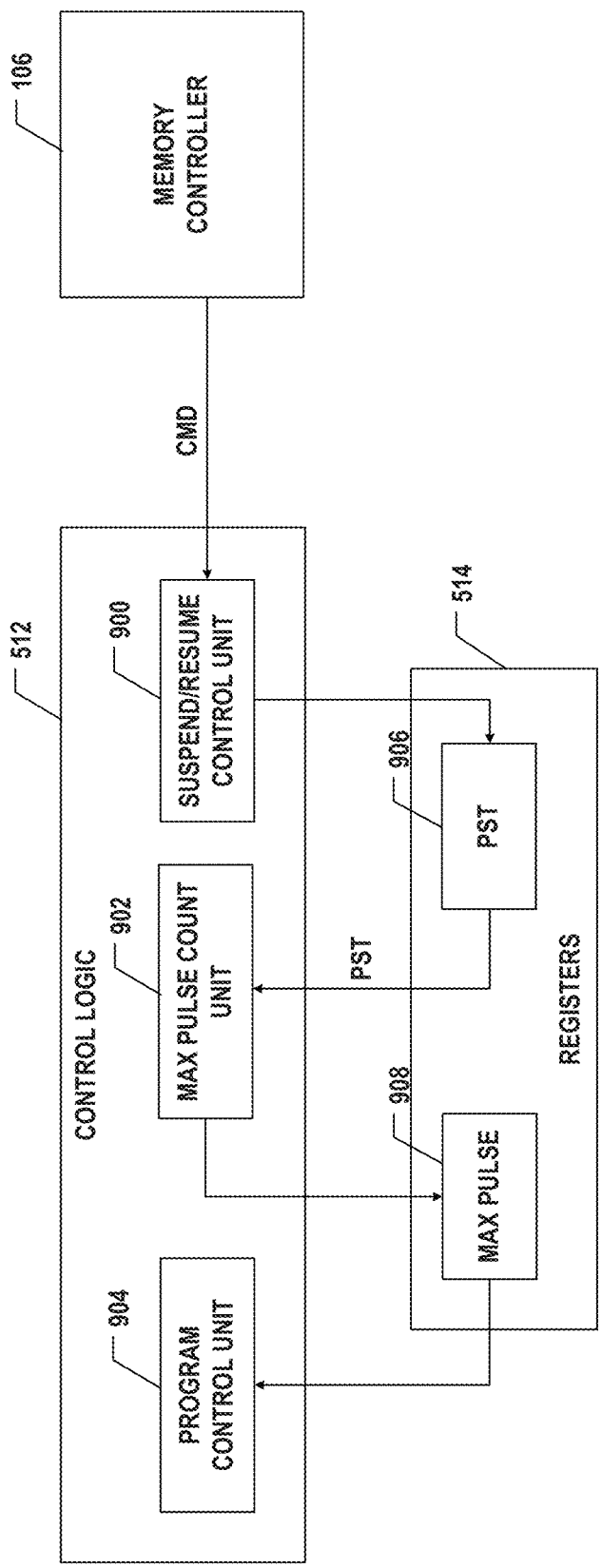
FIG. 9 illustrates a detailed block diagram of control logic and a register of the memory device in FIG. 1, according to some aspects of the present disclosure.

As shown in FIGS. 3, 4A, and 5, control logic 512 of peripheral circuits 302 can be further configured to obtain the number of occurrences of one or more suspensions (also referred to herein as the number of suspension occurrences or the suspension occurrence number) during the program operation. According to some aspects of the present disclosure, as shown in FIG. 9, control logic 512 tracks the number of suspension occurrences in each program operation in conjunction with registers 514 within memory device 300. As shown in FIG. 9, control logic 512 can include a suspend/resume control unit 900, a maximum pulse count unit 902, and a program control unit. Each unit of control logic 512 described herein can be either a software module and/or a firmware module running on a processor, such as a microcontroller unit (MCU), which is part of control logic 512, or a hardware module of a finite-state machine (FSM), such as an integrated circuit (IC, e.g., application-specific IC (ASIC), field-programmable gate array (FPGA), etc.), or a combination of software module, firmware module, and hardware module. Registers 514 can include two status registers—a program suspension tracking (PST) register 906 and a maximum pulse register 908.

Figure 10:
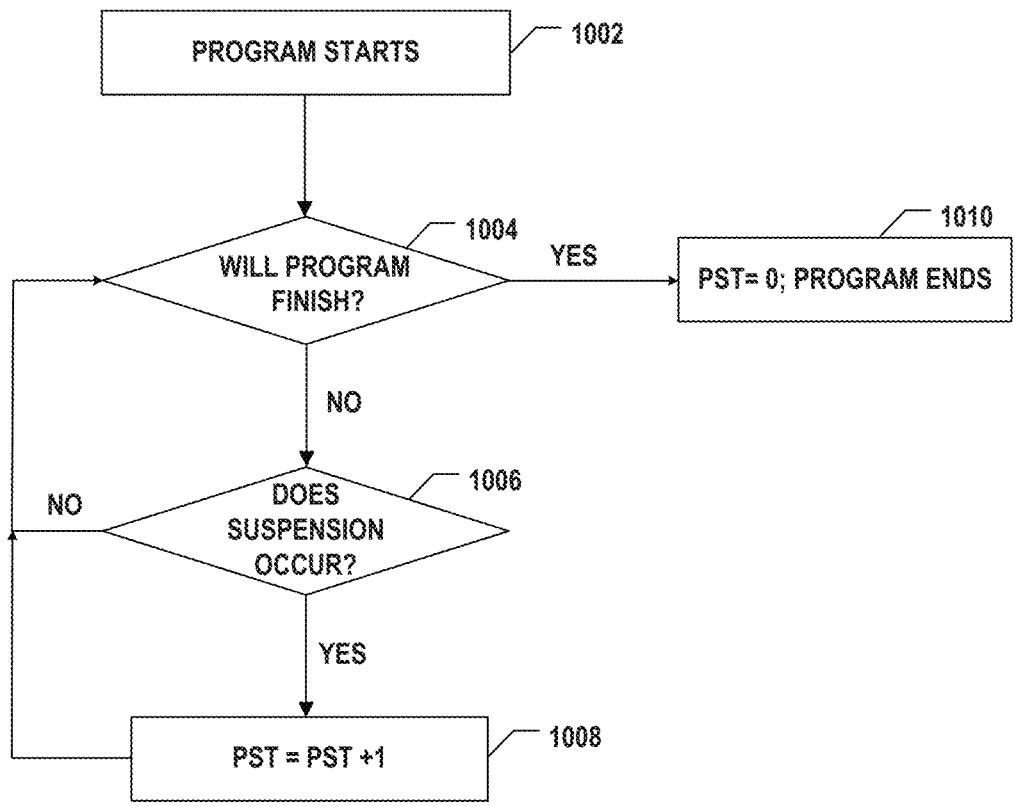
FIG. 10 illustrates a flow chart of a scheme of obtaining the number of occurrences of suspensions during a program operation, according to some aspects of the present disclosure.

In some implementations, suspend/resume control unit 900 is configured to receive the one or more suspend commands (CMD) from memory controller 106 in some program operations. As each suspend command can cause a respective occurrence of program suspension and resumption, suspend/resume control unit 900 of control logic 512 can track the number of suspension occurrences and store the number into PST register 906. As shown in FIG. 10, after the program operation starts at operation 1002, suspend/resume control unit 900 may first check whether the program operation will finish (e.g., when all selected memory cells 306 have passed the verification) at operation 1004. If the answer is NO (the program operation will not finish now), suspend/resume control unit 900 may proceed to operation 1006 to check whether a program suspension occurs (e.g., when receiving a suspend command). If the answer is YES (a program suspension occurs), at operation 1008, suspend/resume control unit 900 may update the tracked number of suspension occurrences stored in PST register 906 (e.g., by adding 1 to PST). If the answer is NO (no program suspension occurs) or after updating the number of suspension occurrences, suspend/resume control unit 900 may return back to operation 1004 to check whether the program operation will finish now. If the answer is YES (the program operation will finish now), the program operation ends at operation 1010, and the number of suspension occurrences stored in PST register 906 may return to 0 for the next program operation. It is understood that in a normal program operation without any suspensions, the number of suspension occurrences stored in PST register 906 may remain 0. If the answer is still NO (the program operation will still not finish now), suspend/resume control unit 900 may repeat operation 1006 as described above. That is, as long as the current program operation has not finished yet, suspend/resume control unit 900 can continuously track the number of suspension occurrences and update the number in PST register 906.

Figure 11:
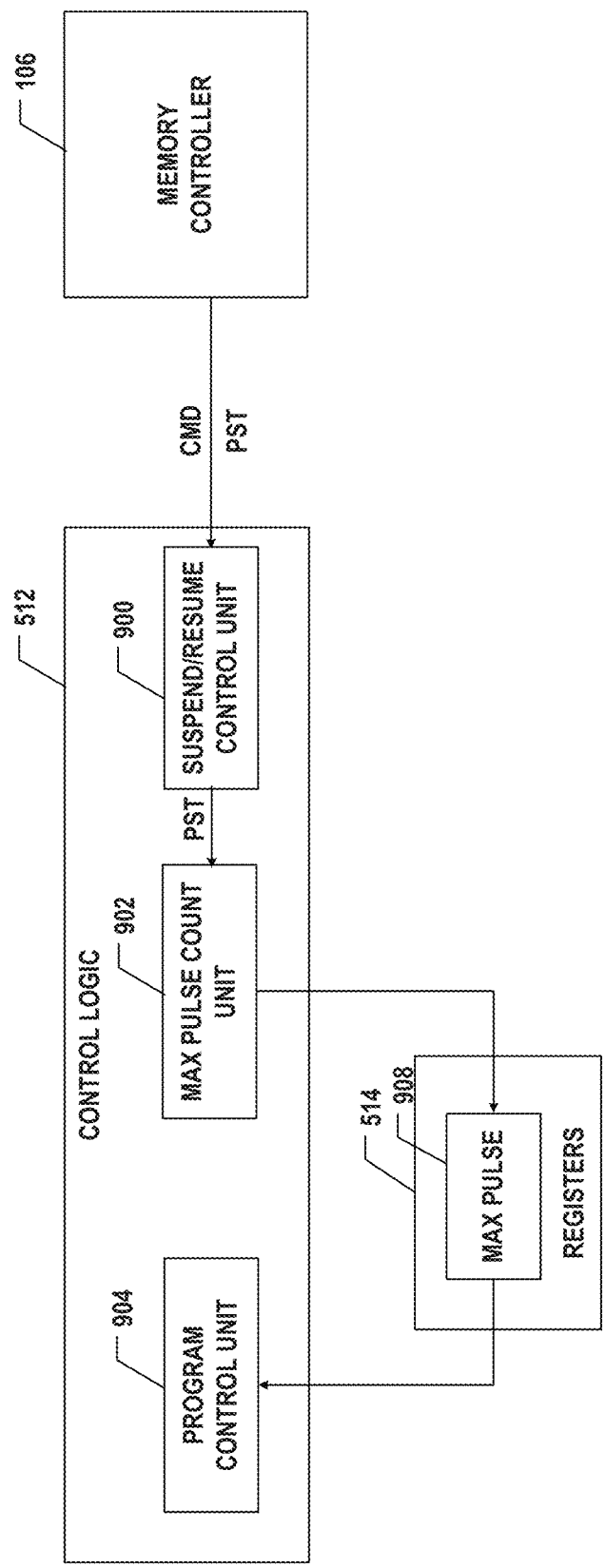
FIG. 11 illustrates another detailed block diagram of control logic and a register of the memory device in FIG. 1, according to some aspects of the present disclosure.

According to some aspects of the present disclosure, as shown in FIG. 11, control logic 512 does not track the number of suspension occurrences in each program operation in conjunction with registers 514 within memory device 300, but instead receives the number of suspension occurrences from memory controller 106. As shown in FIG. 11, similar to FIG. 9, control logic 512 can include suspend/resume control unit 900, maximum pulse count unit 902, and program control unit 904 as well. Registers 514 can still include maximum pulse register 908, but not PST register 906 (shown in FIG. 9).

In some implementations, besides the one or more suspend commands (CMD), suspend/resume control unit 900 also receives the number of suspension occurrences (PST) from memory controller 106 in some program operations. That is, memory controller 106 can record the number of suspension occurrences, for example, based on the number of suspend commands sent to control logic 512 of each memory device 300 in the current program operation, and transmit the number of suspension occurrences to suspend/resume control unit 900. In some implementations, the number of suspension occurrences is transmitted along with the transmission of each suspend command. That is, the number of suspension occurrences received by suspend/resume control unit 900 from memory controller 106 is updated each time when a new suspend command is received. It is understood that regardless of whether the number of suspension occurrences is tracked internally (e.g., within memory device 300) or externally (e.g., by memory controller 106), the number of suspension occurrences may be dynamically updated during each program operation as the number of program suspensions increases.

As shown in FIGS. 3, 4A, and 5, control logic 512 of peripheral circuits 302 can be further configured to determine the program pulse limit for the ongoing program operation based on the number of occurrences of the suspensions. In some implementations, control logic 512 is configured to calculate the program pulse limit based on a default program pulse limit, a weight, and the number of occurrences of the suspensions. Maximum pulse count unit 902 of control logic 512 can be configured to retrieve the number of suspension occurrences (PST) from PST register 906 as shown in FIG. 9, or receive the number of suspension occurrences (PST) from memory controller 106 directly through suspend/resume control unit 900 as shown in FIG. 10. Nevertheless, maximum pulse count unit 902 can be configured to calculate the program pulse limit (program_max_pulse_count) based on the obtained number of suspension occurrences (PST), a weight (w, a.k.a, factor), and a default program pulse limit (program_max_pulse_count_def).

In some implementations, maximum pulse count unit 902 relaxes (e.g., increases) the program pulse limit of a program operation by a certain degree that is correlated to the number of suspension occurrences in the same program operation. For example, the higher the number of suspension occurrences is, the larger degree of relaxation maximum pulse count unit 902 may calculate. In one example, the degree of relaxation to the program pulse limit is proportional to the number of suspension occurrences. In some implementations, a weight may be set in advance (i.e., preset) to define a linear proportional relationship between the number of suspension occurrences and the degree of relaxation. For example, maximum pulse count unit 902 may calculate a weighted number of suspensions based on the weight and the number of occurrences of the suspensions, which is indicative of the degree of relaxation. Maximum pulse count unit 902 then may adjust the default program pulse limit based on the weighted number of occurrences of the suspensions, for example, according to the following Equation 1:

$$\text{program\_max\_pulse\_count} = \text{program\_max\_pulse\_count\_def} + w \times \text{PST} \quad (1).$$

The weight (w) can be set based on various factors or any combinations thereof. In some implementations, the weight is set based on the difference between the resumed incremental voltage and the default incremental voltage (e.g., Δ ISPP in FIGS. 7 and 8). As described above with respect to FIGS. 7 and 8, the larger the difference between the resume and default incremental voltages is, the larger number of program pulses may be needed to reach the same target program voltage. Accordingly, the larger the difference between the resume and default incremental voltages is, the larger the weight may be to relax more on the program pulse limit. In some implementations, the weight is set based on the location of select word line 318 among word lines 318. As described above with respect to FIG. 4A, the location of select word line 318 may affect the program speed of memory cells 306 coupled to select word lines 318 due to the nonuniform lateral dimension (e.g., diameter) of channel structure 412 of NAND memory string 308 along the vertical direction. In one example, since select word line 318 coupled to memory cells 306 with a slower program speed may reach the program pulse limit more easily, the corresponding weight may be set larger to relax more on the program pulse limit. In some implementations, the weight is set based on the default program pulse limit. In some cases, a relatively larger margin may have already been reserved when setting the default program pulse limit, such that the corresponding weight may be set relatively smaller as the program pulse limit has already been relaxed by the default program pulse limit.

It is understood that in some examples, the weight may be set based on any other suitable factors or combinations thereof. It is also understood that in some examples, a non-linear relationship between the degree of relaxation and the number of suspension occurrences may be applied to calculate the degree of relaxation and adjust the default program pulse limit. It is further understood that in some examples, to adjust the degree of relaxation may not be added to the default program pulse limit directly, but instead, may be used as a weight to linearly adjust the default program pulse limit or a factor in a non-linear way to adjust the default program pulse limit. Nevertheless, the obtained number of suspension occurrences may be used to adjust the default program pulse limit to dynamically determine the program pulse limit for each program operation in any suitable ways. It is understood that since the number of suspension occurrences may be dynamically updated during each program operation as the number of program suspensions increases, during the program operation, the program pulse limit may be dynamically updated as well as the number of program suspensions increases. On the other hand, for normal program operations without any program suspension, the program pulse limit may remain the default program pulse limit, so that the risk of threshold voltage shift due to program disturbance would not be increase for normal operations.

As shown in FIGS. 9 and 11, maximum pulse count unit 902 can be configured to store the calculated program pulse limit into maximum pulse register 908 and dynamically update the program pulse limit when the number of program suspensions changes.

As shown in FIGS. 3, 4A, and 5, control logic 512 of peripheral circuits 302 can be further configured to in response to the number of program pluses in the program operation reaching the program pulse limit, terminate the program operation. As shown in FIGS. 9 and 11, in some implementations, program control unit 904 of control logic 512 is configured to monitor the number of program pulses that have been applied by row decoder/word line driver 508 to select word line 318 in the current program operation, and compare the number with the program pulse limit stored in maximum pulse register 908. In response to the number of program pulses reaching the most recent updated program pulse limit, program control unit 904 is configured to instruct peripheral circuits 302, such as row decoder/word line driver 508, to terminate the ongoing program operation even the program operation is not finished yet (e.g., not all select memory cells 306 have been successfully programmed), according to some implementations. Conversely, in response to the number of program pluses not reaching the most recent updated program pulse limit yet, program control unit 904 may not instruct peripheral circuits 302 to terminate the ongoing program operation. As the program pulse limit is dynamically updated based on the number of program suspensions in the current program operation, the termination of the ongoing program operation due to the program pulse limit can also be dynamically adjusted to accommodate the frequency of program suspensions occurring in the ongoing program operation.

Figure 12:
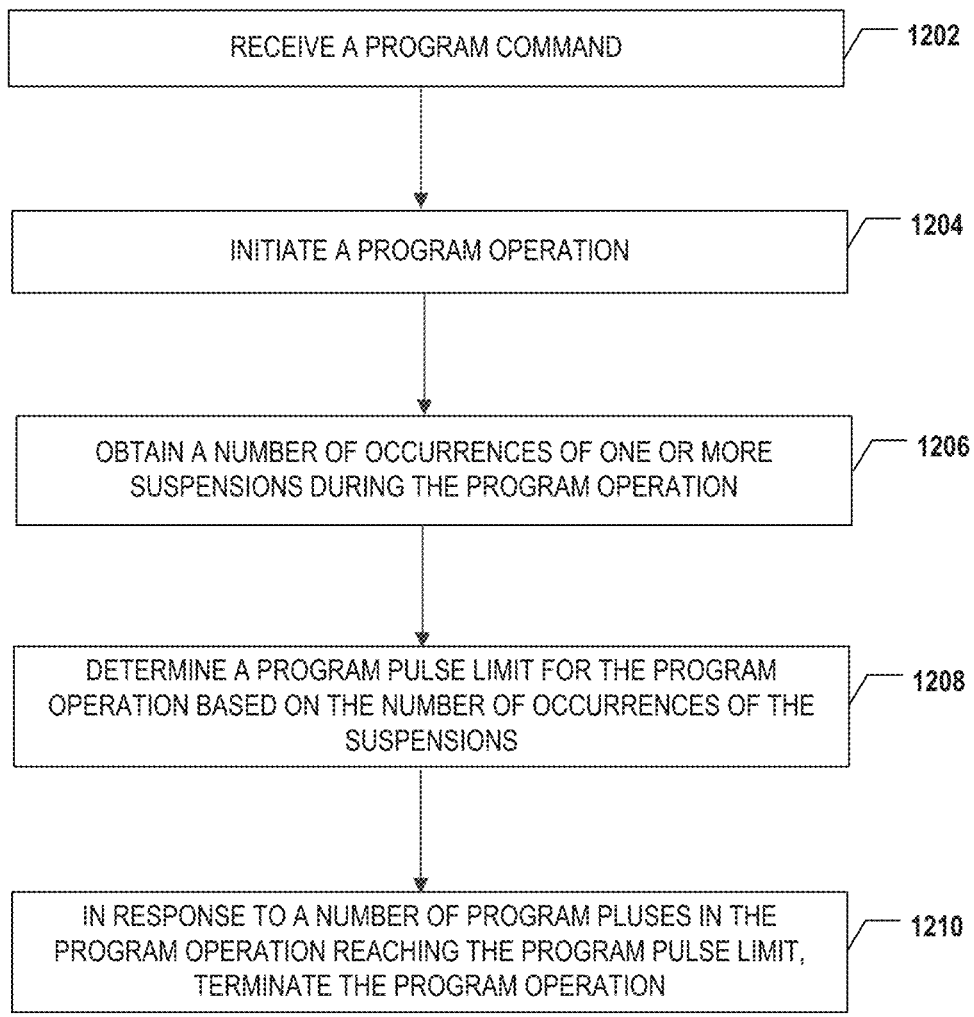
FIG. 12 illustrates a flowchart of a method for operating a memory device, according to some aspects of the present disclosure.

FIG. 12 illustrates a flowchart of a method 1200 for operating a memory device, according to some aspects of the present disclosure. The memory device may be any suitable memory device disclosed herein, such as memory device 300. Method 1200 may be implemented by peripheral circuits 302, such as control logic 512, registers 514, and row decoder/word line driver 508. It is understood that the operations shown in method 1200 may not be exhaustive and that other operations can be performed as well before, after, or between any of the illustrated operations. Further, some of the operations may be performed simultaneously, or in a different order than shown in FIG. 12.

Referring to FIG. 12, method 1200 starts at operation 1202, in which a program command is received. For example, control logic 512 may receive a program operation on select memory cells 306 (e.g., in NAND memory strings 308) in a select page 320 of memory cell array 301 from memory controller 106 through interface 516.

Method 1200 proceeds to operation 1204, as illustrated in FIG. 12, in which a program operation is initiated in response to receiving the program command. For example, control logic 512 may send control signals to at least row decoder/word line driver 508, column decoder/bit line driver 506, and voltage generator 510 to initiate the program operation on select memory cell 306 coupled to select word line 318. In some implementations, word line driver 508 applies a series of program pulses with incremental voltages (e.g., according to an ISPP scheme) to select word line 318 to program select memory cell 306.

In some implementations, one or more suspensions occur during the program operation to temporarily suspend the program operation. To cause each suspension, a respective suspend command is received during the program operation, according to some implementations. In some implementations, the suspend command is received while applying a program pulse on the select word line. For example, during the ongoing program operation, control logic 512 may receive a suspend command from memory controller 106. The suspend command may be issued by memory controller 106 when an interrupt occurs. The interrupt may be any request by host 108 that needs to suspend the ongoing program operation, so that the event can be processed in a timely manner.

In some implementations, in response to the completion of another operation triggered by the suspend command, the program operation is resumed. For example, in response to the completion of the other operation, control logic 512 may retrieve the information of the suspended program operation stored in registers 514 and send control signals to row decoder/word line driver 508, column decoder/bit line driver 506, and voltage generator 510 to resume the suspended program operation based on the retrieved information from registers 514. In one example, row decoder/word line driver 508 may apply a program pulse immediately after the resumption of the program operation with a resumed incremental voltage. In some implementations, the resumed incremental voltage of the program pulse can be smaller than the default incremental voltage of the program pulses to address the over-program issue caused by program suspension and resumption.

Method 1200 proceeds to operation 1206, as illustrated in FIG. 12, in which the number of occurrences of one or more suspensions during the program operation is obtained. For example, control logic 512 may obtain the number of suspension occurrences during the program operation. In some implementations, the number of occurrences of the suspensions is tracked during the program operation, and the tracked number of occurrences of the suspensions is stored. For example, control logic 512 may track the number of suspension occurrences during the program operation, and registers 514 (e.g., PST register 906) may store the tracked number of suspension occurrences. In some implementations, the number of occurrences of the suspensions during the program operation is received. For example, memory controller 106 may record the number of suspension occurrences during the program operation (e.g., the same number as the suspended commands sent by memory controller 106) and transmit the number of suspension occurrences to control logic 512.

Method 1200 proceeds to operation 1208, as illustrated in FIG. 14, in which a program pulse limit for the program operation is determined based on the number of occurrences of the suspensions. For example, control logic 512 may determine the program pulse limit (e.g., the upper limit/ maximum value). In some implementations, the program pulse limit is calculated based on a default program pulse limit, a weight, and the number of occurrences of the suspensions. In some implementations, a weighted number of occurrences of the suspensions is calculated based on the weight and the number of occurrences of the suspensions, and the default program pulse limit is adjusted based on the weighted number of occurrences of the suspensions. For example, control logic 512 may calculate the program pulse limit based on the default program pulse limit, the weight, and the number of occurrences of the suspensions. In one example, control logic 512 may calculate the weighted number of suspensions based on the weight and the number of occurrences of the suspensions, and may adjust the default program pulse limit based on the weighted number of occurrences of the suspensions. The weight can be set based on various factors, such as the difference between the resumed incremental voltage and the default incremental voltage, the location of the select word line among the word lines, and/or the default program pulse limit.

Method 1200 proceeds to operation 1210, as illustrated in FIG. 12, in which the program operation is terminated in response to the number of program pluses in the program operation reaching the program pulse limit. For example, in response to the number of program pluses in the program operation reaching the program pulse limit, control logic 512 may send control signals to row decoder/word line driver 508, column decoder/bit line driver 506, and voltage generator 510 to terminate the program operation before the program operation finishes (i.e., all selected memory cells 306 are successfully programmed/pass the verification). It is understood that in some examples, the program operation may finish before the number of program pluses in the program operation reaches the program pulse limit, even with one or more suspensions during the program operation. It is also understood that in some examples, the program operation may finish without any suspensions. It is further understood that in some examples, the program operation may be terminated before the program operation finishes in response to the number of program pluses in the program operation reaching the program pulse limit even without any suspensions.

According to one aspect of the present disclosure, a memory device includes memory cells, and a peripheral circuit coupled to the memory cells. The peripheral circuit is configured to initiate a program operation on a selected memory cell of the memory cells, obtain a number of occurrences of one or more suspensions during the program operation, and determine a program pulse limit for the program operation based on the number of occurrences of the suspensions.

In some implementations, the peripheral circuit is further configured to, in response to a number of program pluses in the program operation reaching the program pulse limit, terminate the program operation.

In some implementations, to determine the program pulse limit, the peripheral circuit includes control logic configured to calculate the program pulse limit based on a default program pulse limit, a weight, and the number of occurrences of the suspensions.

In some implementations, to calculate the program pulse limit, the control logic is configured to calculate a weighted number of suspensions based on the weight and the number of occurrences of the suspensions, and adjust the default program pulse limit based on the weighted number of occurrences of the suspensions.

In some implementations, the memory device further includes word lines coupling the peripheral circuit to the memory cells. In some implementations, the peripheral circuit includes a word line driver coupled to a select word line of the word lines that is coupled to the select memory cell, and the word line driver is configured to apply program pulses with incremental voltages to the select word line. In some implementations, a resumed incremental voltage of the program pulse immediately after a resumption of the program operation is smaller than a default incremental voltage of the program pulses.

In some implementations, the weight is set based on a difference between the resumed incremental voltage and the default incremental voltage.

In some implementations, the weight is set based on a location of the select word line among the word lines.

In some implementations, the weight is set based on the default program pulse limit.

In some implementations to obtain the number of occurrences of the suspensions, the peripheral circuit includes control logic configured to track the number of occurrences of the suspensions during the program operation, and a register coupled to the control logic and configured to store the tracked number of occurrences of the suspensions.

In some implementations, to obtain the number of occurrences of the suspensions, the peripheral circuit includes control logic configured to receive the number of occurrences of the suspensions during the program operation from a memory controller.

In some implementations, the memory cells are in NAND memory strings.

According to another aspect of the present disclosure, a system includes a memory device configured to store data, and a memory controller coupled to the memory device. The memory device includes memory cells, and a peripheral circuit coupled to the memory cells. The peripheral circuit is configured to initiate a program operation on a selected memory cell of the memory cells, obtain a number of occurrences of one or more suspensions during the program operation, and determine a program pulse limit for the program operation based on the number of occurrences of the suspensions. The memory controller is configured to transmit a program command to the peripheral circuit to initiate the program operation, and transmit one or more suspend commands after the program command to the peripheral circuit to cause the one or more suspensions during the program operation.

In some implementations, the system includes an SSD or a memory card.

In some implementations, the memory controller is further configured to transmit the number of occurrences of the suspensions during the program operation to the peripheral circuit.

In some implementations, the memory device includes a 3D NAND memory device, and the memory cells are in NAND memory strings.

According to still another aspect of the present disclosure, a method for operating a memory device is provided. The memory device includes memory cells. A program operation is initiated on a select memory cell of the memory cells. A number of occurrences of one or more suspensions is obtained during the program operation. A program pulse limit for the program operation is determined based on the number of occurrences of the suspensions.

In some implementations, in response to a number of program pluses in the program operation reaching the program pulse limit, the program operation is terminated.

In some implementations, to determine the program pulse limit, the program pulse limit is calculated based on a default program pulse limit, a weight, and the number of occurrences of the suspensions.

In some implementations, to calculate the program pulse limit, a weighted number of occurrences of the suspensions is calculated based on the weight and the number of occurrences of the suspensions, and the default program pulse limit is adjusted based on the weighted number of occurrences of the suspensions.

In some implementations, the memory device further includes a select word line coupled to the select memory cell, and program pulses with incremental voltages are applied to the select word line. In some implementations, a resumed incremental voltage of the program pulse immediately after a resumption of the program operation is smaller than a default incremental voltage of the program pulses.

In some implementations, the weight is set based on a difference between the resumed incremental voltage and the default incremental voltage.

In some implementations, the weight is set based on a location of the select word line among word lines.

In some implementations, the weight is set based on the default program pulse limit.

In some implementations, the program voltage on the select word line is discharged, and the SSG voltage is applied on the SSG line while discharging the program voltage on the select word line.

In some implementations, to obtain the number of occurrences of the suspensions, the number of occurrences of the suspensions is tracked during the program operation, and the tracked number of occurrences of the suspensions is stored.

In some implementations, to obtain the number of occurrences of the suspensions, the number of occurrences of the suspensions during the program operation is received.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
memory cells;
word lines coupled to the memory cells; and
a peripheral circuit coupled to the word lines and configured to:
apply program pulses to a selected word line of the word lines in a program operation;
obtain a number of occurrences of suspensions during the program operation; and
determine an upper limit on a total number of program pulses for the program operation based on the number of occurrences of the suspensions during the program operation, wherein the upper limit represents a maximum number of program pulses allowed in the program operation, and the total number of program pulses for the program operation is smaller than or equal to the upper limit.

2. The memory device of claim 1, wherein the peripheral circuit is further configured to:
in response to the number of occurrences of the suspensions being equal to zero, determine the upper limit to be a first number.

3. The memory device of claim 2, wherein the peripheral circuit is further configured to:
in response to the number of occurrences of the suspensions being greater than zero, determine the upper limit to be a second number, wherein the second number is greater than the first number.

4. The memory device of claim 1, wherein the peripheral circuit is further configured to:
in response to the total number of program pluses in the program operation reaching the upper limit, terminate the program operation.

5. The memory device of claim 1, wherein to determine the upper limit on the total number of program pulses, the peripheral circuit comprises control logic configured to calculate the upper limit based on a weight and the number of occurrences of the suspensions.

6. The memory device of claim 5, wherein to calculate the upper limit, the control logic is configured to:
calculate a weighted number of suspensions based on the weight and the number of occurrences of the suspensions; and determine the upper limit on the total number of program pulses based on the weighted number of occurrences of the suspensions.

7. The memory device of claim 5, wherein
the peripheral circuit comprises a word line driver coupled to the word lines;
the word line driver is configured to apply the program pulses with incremental voltages to the select word line; and
a resumed incremental voltage of a program pulse immediately after a resumption of the program operation is smaller than a default incremental voltage of the program pulses.

8. The memory device of claim 7, wherein the weight is based on a difference between the resumed incremental voltage and the default incremental voltage.

9. The memory device of claim 5, wherein the weight is set based on a location of the select word line among the word lines.

10. The memory device of claim 1, wherein to obtain the number of occurrences of the suspensions, the peripheral circuit comprises:
a control logic configured to obtain the number of occurrences of the suspensions during the program operation; and
a register coupled to the control logic and configured to store the number of occurrences of the suspensions.

11. The memory device of claim 1, wherein to obtain the number of occurrences of the suspensions, the peripheral circuit comprises control logic configured to receive the number of occurrences of the suspensions during the program operation from a memory controller.

12. A system, comprising:
a memory device comprising:
memory cells;
word lines coupled to the memory cells; and
a peripheral circuit coupled to the word lines and configured to:
receive a program command and apply program pulses to a selected word line of the word lines in a program operation;
obtain a number of occurrences of suspensions during the program operation; and
determine an upper limit on a total number of program pulses for the program operation based on a number of occurrences of the suspensions during the program operation, wherein the upper limit represents a maximum number of program pulses allowed in the program operation, and the total number of program pulses for the program operation is smaller than or equal to the upper limit; and
a memory controller coupled to the memory device and configured to transmit the program command to the peripheral circuit.

13. The system of claim 12, wherein the memory controller is further configured to transmit suspend commands after the program command to the peripheral circuit to cause the suspensions during the program operation.

14. The system of claim 13, wherein the memory controller is further configured to:
record the number of occurrences of suspensions based on a number of the suspend commands transmitted to the peripheral circuit; and
transmit the number of occurrences of suspensions to the peripheral circuit.

15. The system of claim 13, wherein the peripheral circuit is further configured to record the number of occurrences of suspensions based on a number of the suspend commands received from the memory controller.

16. A method for operating a memory device, the memory device comprising memory cells and word lines coupled to the memory cells, the method comprising:
applying program pulses to a selected word line of the word lines in a program operation;
obtaining a number of occurrences of suspensions during the program operation; and
determining an upper limit on a total number of program pulses for the program operation based on the number of occurrences of the suspensions during the program operation, wherein the upper limit represents a maximum number of program pulses allowed in the program operation, and the total number of program pulses for the program operation is smaller than or equal to the upper limit.

17. The method of claim 16, further comprising, in response to the total number of program pluses in the program operation reaching the upper limit, terminating the program operation.

18. The method of claim 16, wherein determining the upper limit comprises calculating the upper limit based on a weight and the number of occurrences of the suspensions.

19. The method of claim 18, wherein calculating the upper limit comprises:
calculating a weighted number of occurrences of the suspensions based on the weight and the number of occurrences of the suspensions; and
determining the upper limit on the total number of program pulses based on the weighted number of occurrences of the suspensions.

20. The method of claim 16, wherein obtaining the number of occurrences of the suspensions comprises:
obtaining the number of occurrences of the suspensions during the program operation; and
storing the number of occurrences of the suspensions.

* * * * *